United States Patent
Chao et al.

(10) Patent No.: US 7,183,821 B1
(45) Date of Patent: Feb. 27, 2007

(54) APPARATUS AND METHOD OF CONTROLLING CLOCK PHASE ALIGNMENT WITH DUAL LOOP OF HYBRID PHASE AND TIME DOMAIN FOR CLOCK SOURCE SYNCHRONIZATION

(75) Inventors: Tze-hsiang Chao, Hsinchu (TW); Chia-jung Liu, Banciao (TW)

(73) Assignee: Silicon Integrated Systems Corp., Hsinchu (TW)

( * ) Notice: Subject to any disclaimer, the term of this patent is extended or adjusted under 35 U.S.C. 154(b) by 11 days.

(21) Appl. No.: 11/257,258

(22) Filed: Oct. 24, 2005

(51) Int. Cl.
*H03L 7/06* (2006.01)
(52) U.S. Cl. ........................ 327/149; 327/158
(58) Field of Classification Search ................ 327/141, 327/147–150, 152–156, 158, 161, 162; 331/17, 331/25, DIG. 2, 177 V; 375/373–376
See application file for complete search history.

(56) References Cited

U.S. PATENT DOCUMENTS 5,712,582 A * 1/1998 Yokota et al. .............. 327/156

2005/0189974 A1 9/2005 Chao ........................ 327/158

* cited by examiner

*Primary Examiner*—Linh My Nguyen

(57) ABSTRACT

An apparatus and a method of controlling clock phase alignment with a dual loop of a hybrid phase and time domain for clock source synchronization in electronic devices are described. The coarse calibration unit generates a plurality of output signals, the output signals having a plurality of phase intervals therebetween. A predetermined phase angle is divided by the number of the output signals to generate one of the phase intervals. The first fine calibration unit connected to the coarse calibration unit delays the output signals generated from the coarse calibration unit by coupling a programmable delay circuit to adjust the phase of a feedback signal toward the phase of a reference signal. The phase detector connected to the first fine calibration unit is used to detect a phase difference between the reference and the feedback signal and outputting an indicating signal corresponding to the phase difference between the reference and the feedback signal. The controller controls the coarse calibration unit and the first fine calibration unit to align the feedback signal to the reference signal according to the indicating signal generated from the phase detector.

31 Claims, 7 Drawing Sheets

APPARATUS AND METHOD OF CONTROLLING CLOCK PHASE ALIGNMENT WITH DUAL LOOP OF HYBRID PHASE AND TIME DOMAIN FOR CLOCK SOURCE SYNCHRONIZATION

FIELD OF THE INVENTION

The present invention generally relates to an apparatus and a method of controlling clock phase alignment, and more particularly, to an apparatus and a method of controlling clock phase alignment with a dual loop of a hybrid phase and time domain for clock source synchronization in electronic devices.

BACKGROUND OF THE INVENTION

FIG. 1 shows a conventional block diagram of controlling a clock phase alignment in a delay-locked loop (DLL). The DLL includes a phase-interpolated calibration unit 100, a phase detector 102, and a controller 104. The phase-interpolated calibration unit 100 is capable of receiving an input signal (not shown) and calibrates the phase of the input signal according to a reference signal in a phase domain. The phase detector 102 then detects the phase difference between a feedback signal of the phase-interpolated calibration unit 100 and the reference signal. Thereafter, the controller 104 receives the detecting results of the phase detector 102 and is necessarily required to control the phase-interpolated calibration unit 100 by an angular magnitude in the phase domain. The phase-interpolated calibration unit 100 repeatedly adjusts the phase of the feedback signal toward that of the reference signal by interpolating the phase of the feedback signal according to a control signal from the controller 104 until the phase alignment between the feedback signal and the reference signal is achieved.

However, since the phase alignment of the feedback signal to the reference signal is performed in the phase domain by interpolation, the phase-interpolated calibration unit 100 has large power consumption. The implementation of the phase interpolation utilizes complicated current conversions for the signals when the feedback signal is interpolated to the reference signal. Particularly, while the current signal converted from the signal is quite small, additional circuits are required to solve the situation. Therefore, there is a need to additionally raise the size of the circuit so that the layout of the circuit is complicated and the cost of the clock source synchronization is increased.

Moreover, in the prior art, a phase-locked loop (PLL) which is usually used in the clock source synchronization. However, the size of the PLL circuit is too large, thereby resulting in high-noise. Also, the circuit layout of the PLL must be re-designed to downgrade the stability of the circuit since the manufacturing process of the PLL is changed.

As aforementioned, conventional DLL, which calibrates the clock phase in a phase domain, cannot afford the demand of different synchronization sources. The usage of PLL in synchronization source is also subjected to noise and circuit size. Consequently, there is a need to develop a novel delay-locked loop for the synchronization source to provide the electronic devices with a preferred clock phase adjustment of the feedback and the reference signal for reducing the cost and increasing operation efficiency.

SUMMARY OF THE INVENTION

The first objective of the present invention is to provide an apparatus and a method of controlling clock phase alignment with a hybrid phase and time domain for clock source synchronization to coarsely adjust the phase difference between a reference signal and a feedback signal to rapidly select a phase interval in the phase domain for the reference signal by covering a predetermined phase angle, e.g. complete 360 degrees, in the phase domain.

The second objective of the present invention is to provide an apparatus and a method of controlling clock phase alignment with a hybrid phase and time domain for clock source synchronization to precisely align the phase of the feedback signal to that of the reference signal by a programmable delay circuit in a time domain to save the power consumption of the electronic devices.

The third objective of the present invention is to provide an apparatus and a method of controlling clock phase alignment with a hybrid phase and time domain for clock source synchronization to implement the controlling apparatus by digital delay-locked loop to avoid the effect of manufacturing process in the electronic devices.

According to the above objectives, the present invention sets forth an apparatus and a method of controlling clock phase alignment with a hybrid phase and time domain for clock source synchronization. The apparatus comprises a coarse calibration unit, a first fine calibration unit, a phase detector and a controller. The coarse calibration unit generates a plurality of output signals, the output signals having a plurality of phase intervals therebetween. A predetermined phase angle is divided by the number of the output signals to generate one of the phase intervals.

The first fine calibration unit connected to the coarse calibration unit delays one of the output signals generated from the coarse calibration unit by coupling a programmable delay circuit to adjust the phase of a feedback signal toward the phase of the reference signal.

The phase detector connected to the first fine calibration unit is used to detect a phase difference between the reference and the feedback signal and outputting an indicating signal corresponding to the phase difference between the reference and the feedback signal. The controller coupled to the coarse calibration unit, the first fine calibration unit, and the phase detector controls the coarse calibration unit and the first fine calibration unit to align the feedback signal to the reference signal according to the indicating signal from the phase detector.

As result, the clock phase alignment between the reference signal and the feedback signal is performed by a dual loop, i.e. a phase and a time domain. In the phase domain of the coarse calibration unit, the phase difference between a reference signal and a feedback signal is coarsely adjusted to rapidly select a phase interval in the phase domain for the reference signal by covering the predetermined phase angle in the phase domain. In the time domain of the first fine calibration unit, the phase of feedback signal to that of the reference signal is precisely aligned by a programmable delay circuit in a time domain to save the power consumption of the electronic devices. Further, the components of the controlling apparatus are digitally implemented by synthesis design tools to considerably reduce the size of the circuit.

In operation, a plurality of output signals are generated in a coarse calibration unit and each of the output signals has a phase interval therebetween. A predetermined phase angle is divided by the number of the output signals to generate one of the phase intervals in a phase domain. Thereafter, one of the output signals generated in a first fine calibration unit is delayed by coupling a programmable delay circuit in a time domain to adjust a phase of a feedback signal toward a phase of the reference signal. Then, the phase difference between the reference and the feedback signal is detected by a phase detector for outputting an indicating signal corresponding to the phase difference between the reference and the feedback signals. Finally, the coarse calibration unit and the fine calibration unit are controlled by the controller to align the feedback signal to the reference signal according to the indicating signal from the phase detector.

The advantages of the present invention include: (a) adjusting the phase difference between a reference signal and a feedback signal to rapidly select a phase interval in the phase domain for the reference signal by covering the phase range in the phase domain; (b) aligning the phase of feedback signal to that of the reference signal by a programmable delay circuit in a time domain to save the power consumption; (c) implementing the controlling apparatus by a digital delay-locked loop to avoid the variation effect of manufacturing process in the electronic devices; and (d) reducing the size of the circuit by multiplying frequency in coarse calibration unit.

DETAILED DESCRIPTION OF THE PREFERRED EMBODIMENTS

The present invention is directed to an apparatus and a method of controlling clock phase alignment with a hybrid phase and time domain for clock source synchronization to coarsely adjust the phase difference between a reference signal and a feedback signal to rapidly select a phase interval in the phase domain for the reference signal by covering a predetermined phase angle, e.g. complete 360 degrees, in the phase domain. Furthermore, the controlling apparatus precisely aligns the phase of feedback signal to that of the reference signal by a programmable delay circuit in the time domain to save the power consumption of the electronic devices. Moreover, the controlling apparatus implements the controlling apparatus by digital delay-locked loop to avoid the effect of manufacturing process in the electronic devices.

It should be noted that the controlling apparatus is suitable for clock source synchronization in the electronic devices, such as a north bridge, a south bridge, and a central processing unit (CPU) or the combination, and also for any type of clock synchronization mechanisms. It should be noted that the predetermined phase angle can be 90, 180 or 270 degrees, or any degree of phase angles.

Figure 1:
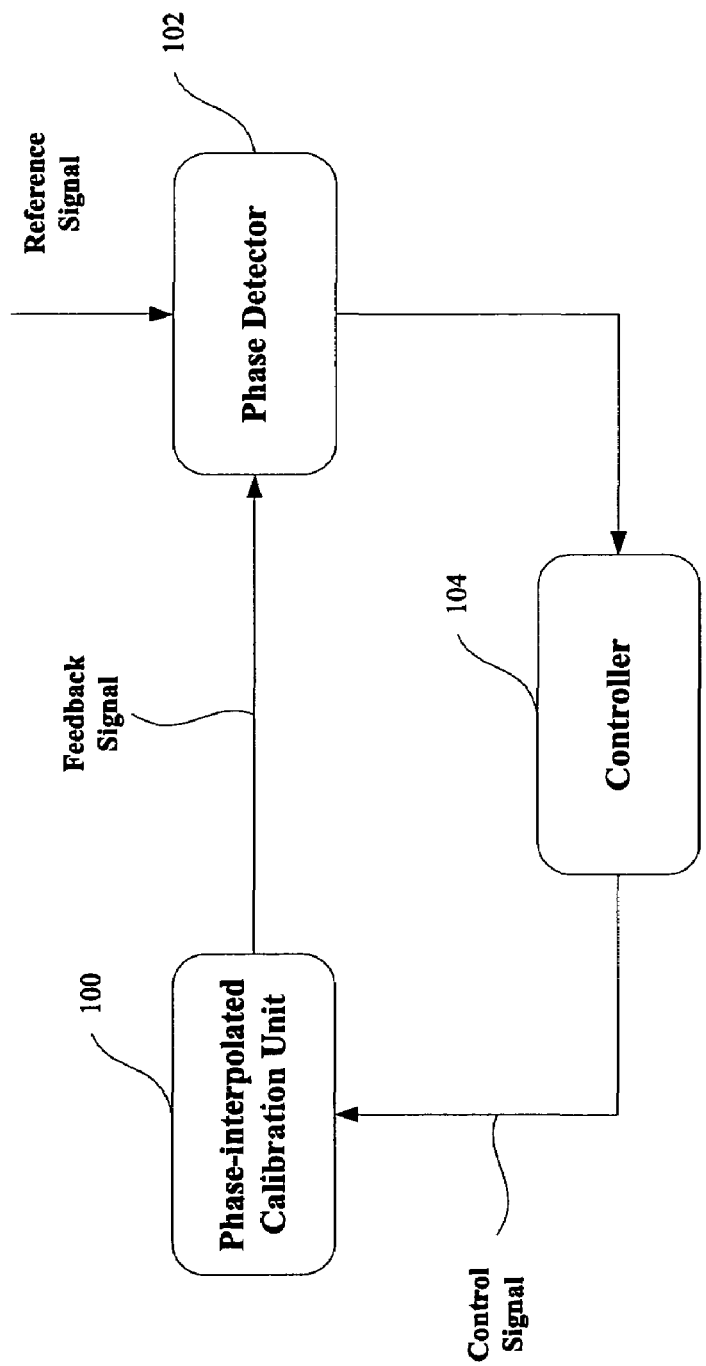
FIG. 1 shows a conventional clock phase alignment in a phase domain for a delay-locked loop.
Figure 2:
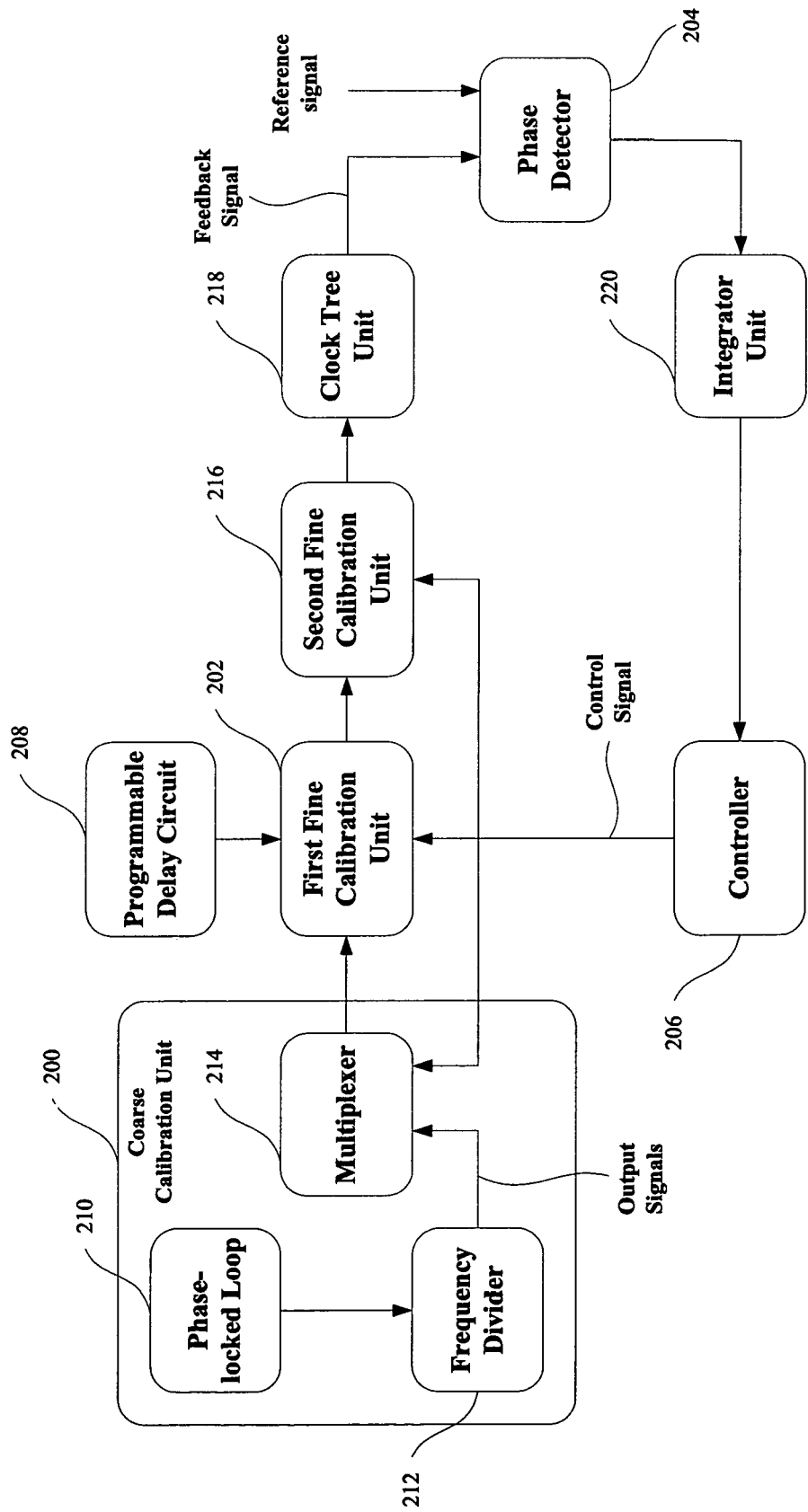
FIG. 2 illustrates a detailed block diagram of an apparatus for controlling clock phase alignment with hybrid phase and time domain according to the present invention.

FIG. 2 illustrates a detailed block diagram of an apparatus for controlling clock phase alignment with a hybrid phase and time domain according to the present invention. The controlling apparatus comprises a coarse calibration unit 200, a first fine calibration unit 202, a phase detector 204, and a controller 206. The coarse calibration unit 200 generates a plurality of output signals, the output signals having a plurality of phase intervals therebetween. A predetermined phase angle is divided by the number of the output signals to generate one of the phase intervals. The first fine calibration unit 202 connected to the coarse calibration unit 200 delays one of the output signals generated from the coarse calibration unit 200 by coupling a programmable delay circuit 208 to adjust the phase of a feedback signal toward the phase of reference signal. Specifically, at least on of the phase intervals is fixed or variable phase interval. Moreover, the phase intervals between the output signals cover the predetermined phase angle or a portion of predetermined phase angle.

The phase detector 204 connected to the first fine calibration unit 202 is used to detect a phase difference between the reference and the feedback signals and outputting an indicating signal corresponding to the phase difference between the reference and the feedback signals. The controller 206 coupled to the coarse calibration unit 200, the first fine calibration unit 202, and the phase detector 204 controls the coarse calibration unit 200 and the first fine calibration unit 202 to align the feedback signal to the reference signal according to the indicating signal from the phase detector 204.

Referring to FIG. 2 again, the coarse calibration unit 200 comprises a phase-locked loop 210, a frequency divider 212, and a multiplexer 214. The phase-locked loop 210 generates a plurality of multiplying frequency signals. The frequency divider 212 coupled to the phase-locked loop 210 divides the multiplying frequency signals into the output signals. The multiplexer 214 coupled to the frequency divider 212 and the controller 206 is used to select one of the output signals to be output into the first fine calibration unit 202 according to a control signal from the controller 206.

In one embodiment, a second fine calibration unit 216 is connected to the first fine calibration unit 202 and the phase detector 204 for interpolating the signal from the first fine calibration unit 202 to improve the precision of the signals from the first fine calibration unit. A clock tree unit 218 coupled to the second fine calibration unit 216 and the phase detector 204 is used to amplify the feedback signal from the second fine calibration unit 216. Preferably, an integrator 220 is located between the phase detector 204 and the controller 206 for integrating the indicating signal from the phase detector 204.

Figure 3A:
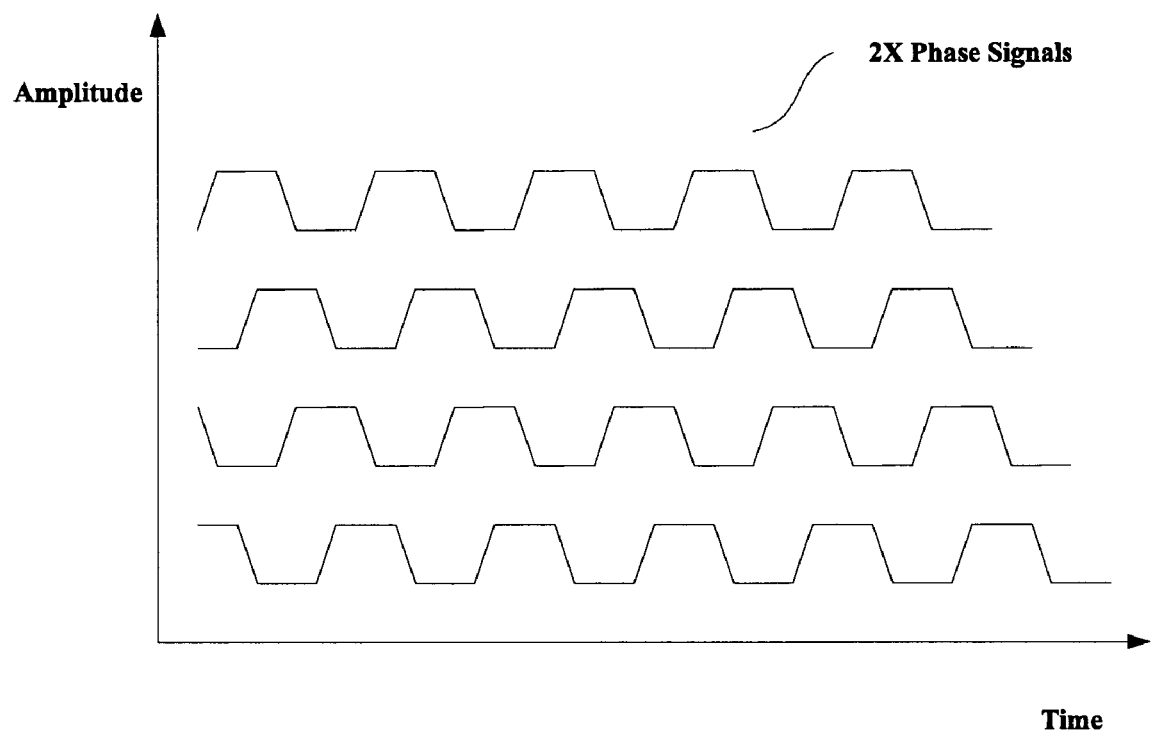
FIGS. 3A and 3B illustrate a timing diagram of multiplying frequency signals of coarse calibration unit in FIG. 2 according to one embodiment of the present invention.
Figure 3B:
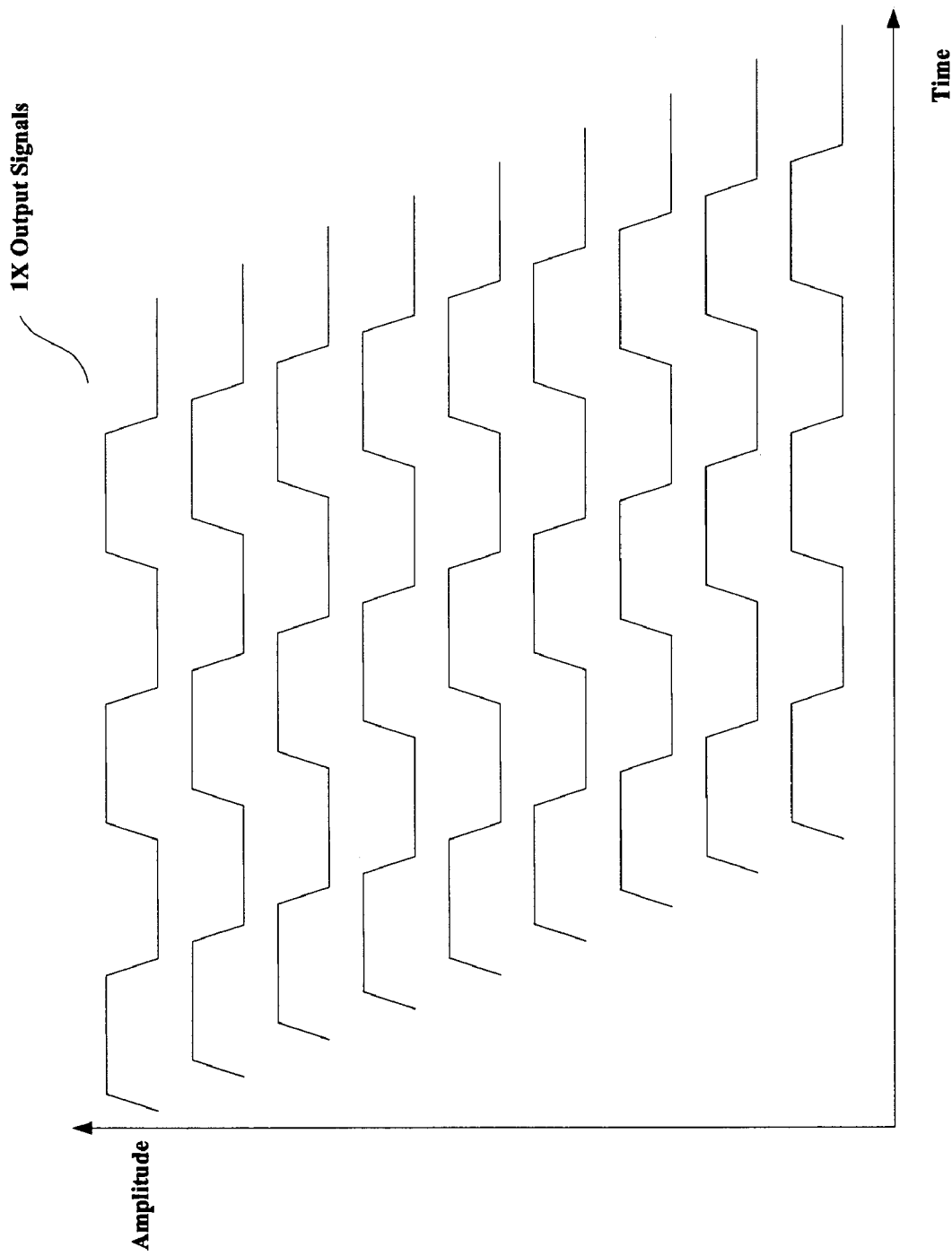

FIGS. 3A and 3B illustrate a timing diagram of multiplying frequency signals of coarse calibration unit in FIG. 2 according to one embodiment of the present invention. In this embodiment, four different phase signals are generated by 2× PLL, as shown in FIG. 3A. Then, in FIG. 3B, the four different phase signals are divided by the frequency divider 212 to generate eight different output signals, e.g. 1× frequency signals in view of the 2× PLL, in a predetermined phase angle so that the reference signal is located in one of the output signals which serves as different feedback signals. Preferably, the 1× frequency signals can be generated by a delay-locked loop generator. Preferably, the delay-locked loop generator is in reference to U.S. application Ser. No. 10/708,373 filed on Feb. 26, 2004 by the same Assignee for further detailed description. Therefore, the phase difference between a reference signal and a feedback signal is coarsely adjusted to rapidly select a phase interval in the phase domain for the reference signal by covering the predetermined phase angle in the phase domain.

Figure 4A:
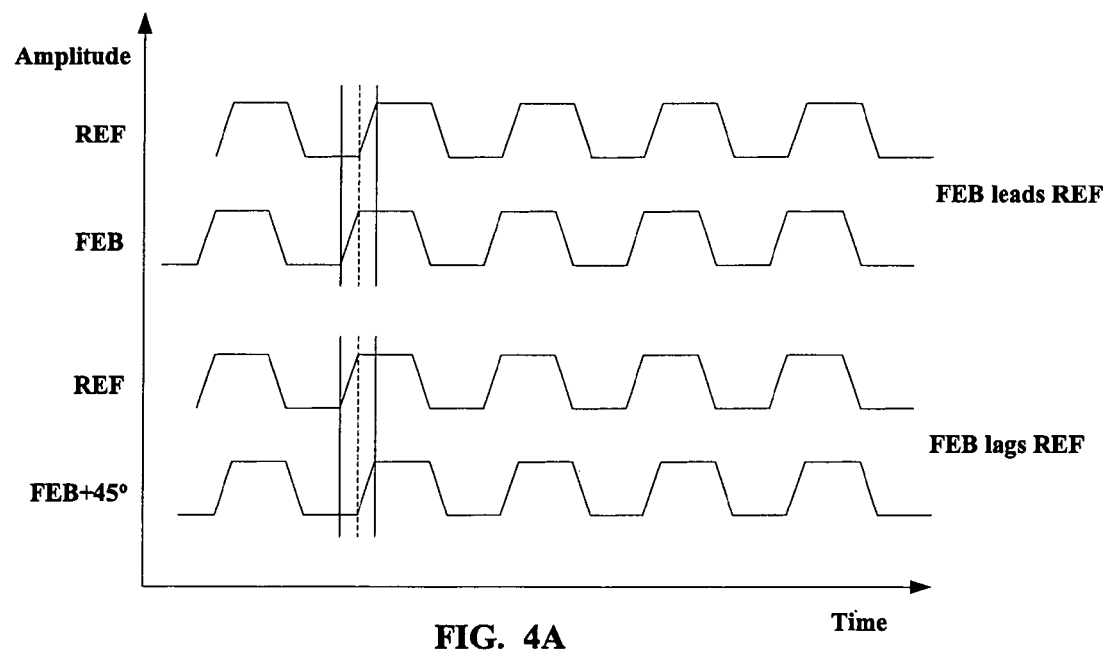
FIGS. 4A and 4B illustrate a timing diagram of a plurality of output signals of the coarse calibration unit in FIG. 2 according to one embodiment of the present invention.
Figure 4B:
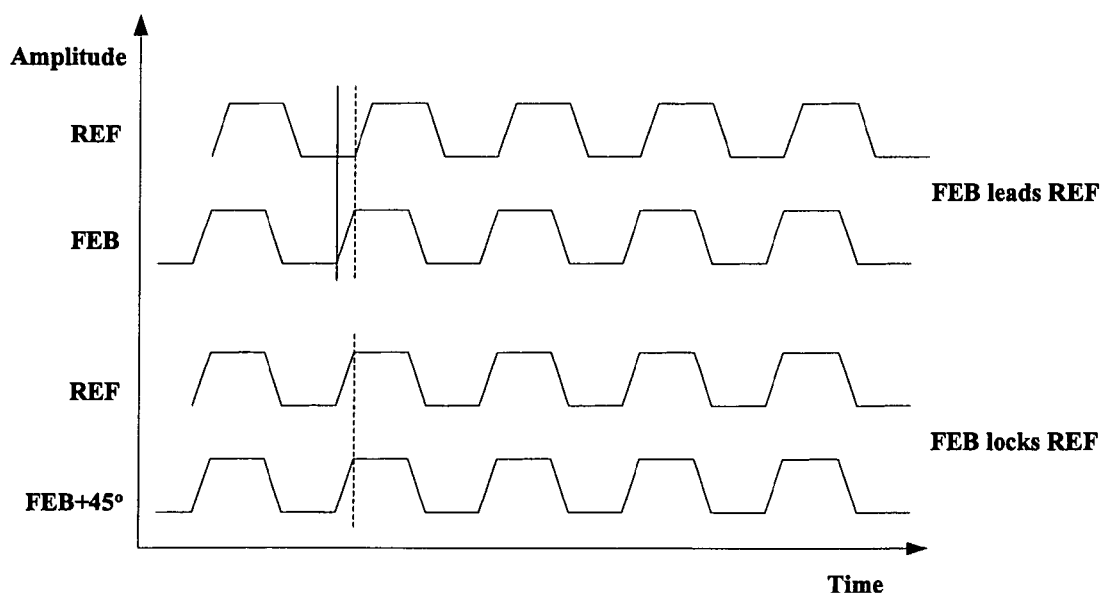

FIGS. 4A and 4B illustrate a timing diagram of a plurality of output signals of the coarse calibration unit in FIG. 2 according to one embodiment of the present invention. The feedback signal is coarsely tuned in the phase intervals which cover the predetermined phase angle and the tuned feedback signal is selected from the phase intervals in the coarse calibration unit to serves as an input signal to the first fine calibration unit 202. The coarse calibration unit 200 is measured by an angular magnitude in the phase domain. In FIG. 4A, one of the output signals from the coarse calibration unit 200 is selected as the feedback signal and then is increased by the phase interval, e.g. 45 degrees, via the controller to repeatedly compare the reference signal with the feedback signals, respectively so that the phase of the reference signal is from a lead status to a lag status with respect to the feedback signal.

In FIG. 4B, one of the output signals from the coarse calibration unit 200 is selected as the feedback signal and then is increased by the phase interval, e.g. 45 degrees, so that the phase of the reference signal is from a lead status to a lock status with respect to the feedback signal. In other words, the reference signal is located between the lead and the lag or the lock output signal. As a result, in the present invention, the controller rapidly identifies the phase interval of the reference signal by coarsely adjusting in the different output signals to select one to the first fine calibration unit. In one embodiment, the phase comparison between the reference signal and the feedback signal in the coarse calibration unit 200 is preferably implemented by flip-flop components and delay circuits.

Figure 5A:
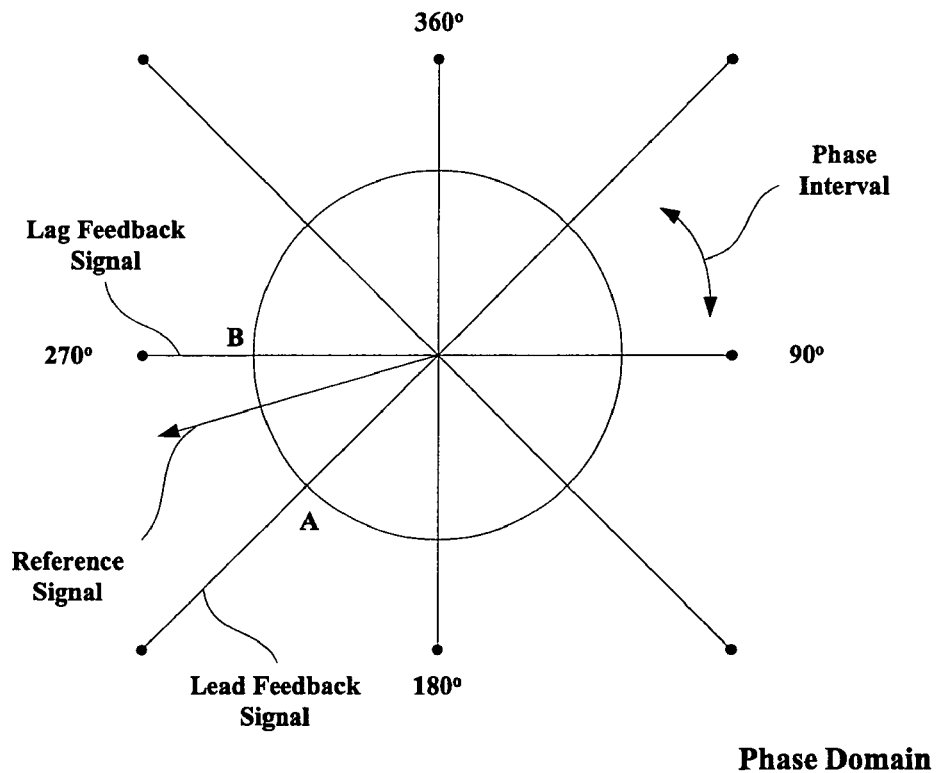
FIG. 5A illustrates the reference and the feedback signal located in the complete 360 degrees represented by a phase domain having a plurality of phase intervals according to one embodiment of the present invention.
Figure 5B:
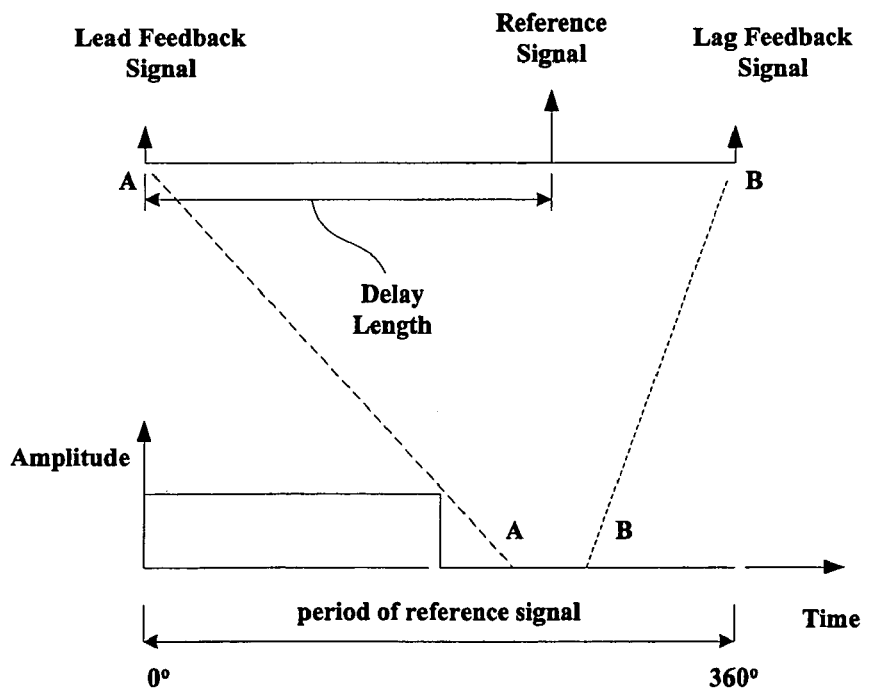
FIG. 5B illustrates the reference and the feedback signal located in a phase interval represented by a time domain in the first fine calibration unit according to the present invention.

FIG. 5A illustrates the reference and the feedback signal located in the predetermined phase angle represented by a phase domain having a plurality of phase intervals according to the present invention. FIG. 5B illustrates the reference and the feedback signal located in a phase interval represented by a time domain in the first fine calibration unit according to the present invention.

In FIG. 5A, the predetermined phase angle with the reference signal is divided into a plurality of phase intervals. In this embodiment, the reference signal is located in one of the phase intervals and the reference signal in the phase domain is measured by angular magnitude. Thus, the reference signal can always be detected by the controller since the predetermined phase angle is continuous.

In FIG. 5B, the phase interval of the reference signal in FIG. 5B is represented in a time domain. In this embodiment, the reference signal located in the phase interval is measured by a delay length generated by the programmable delay circuit in the time domain. Specifically, the position of the reference signal in the phase domain is mapped to the time domain to precisely adjust the feedback signal toward the reference signal.

As a result, the clock phase alignment between the reference signal and the feedback signal is performed by a dual loop, i.e. a phase and a time domain. In the phase domain of the coarse calibration unit, the phase difference between a reference signal and a feedback signal is coarsely adjusted to rapidly select a phase interval in the phase domain for the reference signal by covering the predetermined phase angle in the phase domain. In the time domain of the first fine calibration unit, the phase of feedback signal to that of the reference signal is precisely aligned by a programmable delay circuit in a time domain to save on the power consumption of the electronic devices. Furthermore, the components of the controlling apparatus are digitally implemented by synthesis design tools to considerably reduce the size of the circuit.

In one embodiment of the present invention, the delay length of the programmable delay circuit of the first fine calibration unit is at least 1/N time the period of the reference signal to span at least one phase interval, where N is the number of output signals. Preferably, the delay length of the first fine calibration unit is at least 1.5/N or 2.0/N times the period of the reference signal to effectively exceed the cover range of one phase interval.

Figure 6:
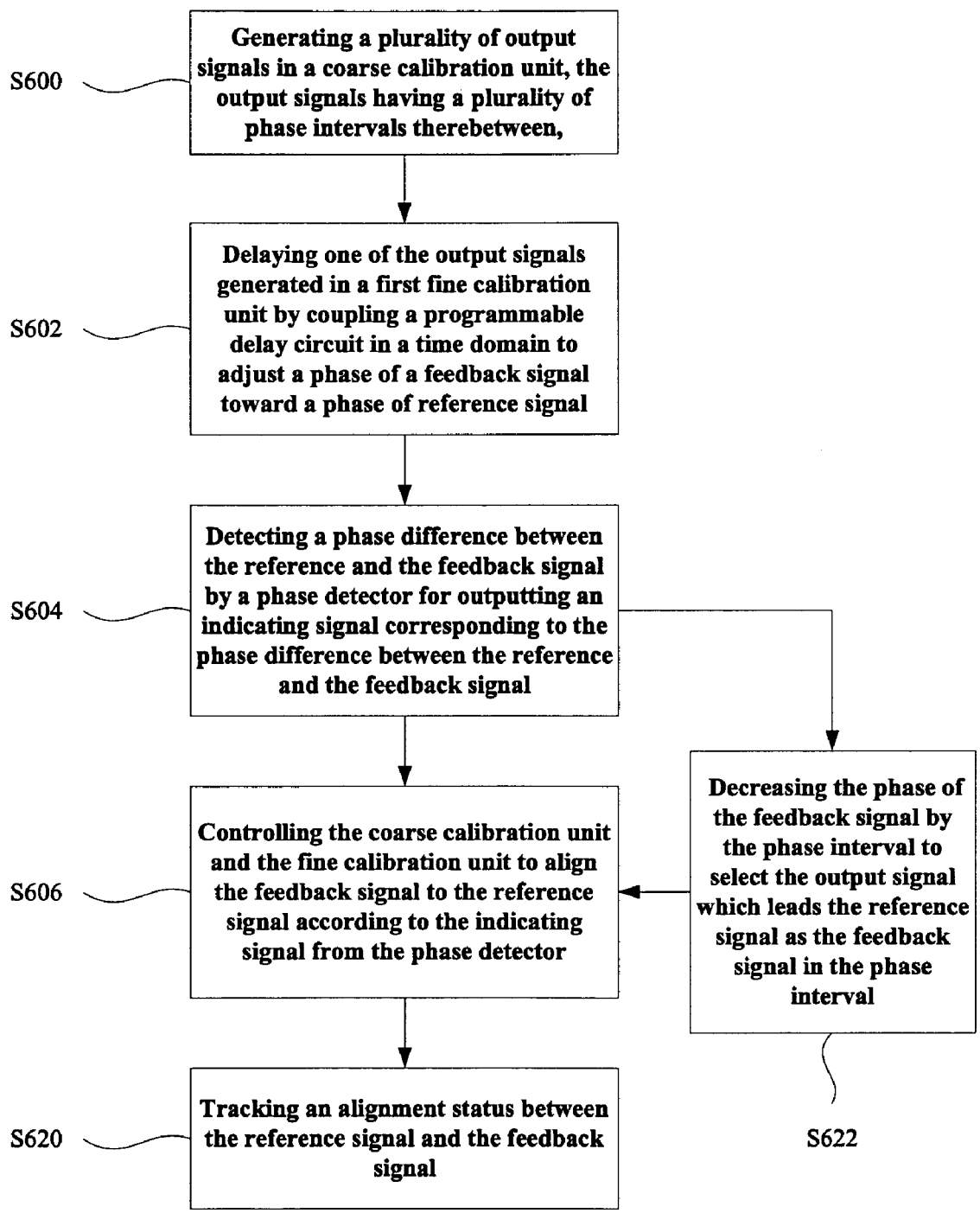
FIG. 6 shows a flow chart of controlling clock phase alignment with dual loop, hybrid phase and time domain according to the present invention.

FIG. 6 shows a flow chart of controlling clock phase alignment with a hybrid phase and time domain for a clock source synchronization according to the present invention. Starting at step S600, a plurality of output signals are generated in a coarse calibration unit and each of the output signals has a phase interval therebetween. A predetermined phase angle is divided by the number of the output signals to generate one of the phase intervals in a phase domain.

After step S600, the phase of the feedback signal is increasingly inclined from 0 degree or decreasingly declined from 360 degrees by the phase interval, as shown in the steps. Then, the controller repeatedly compares the phase of the reference signal with that of the feedback signals, respectively. During the step of increasing the phase of the feedback signal by the phase interval, the comparison results between the reference and the feedback signal from the phase detector are recorded by the controller. When the comparison results between the reference signal and feedback signal are changed from a lead status into a lag or a lock status, the feedback signal is selected from the phase intervals for transmitting the output signal into the first fine calibration unit. Preferably, the phase of the feedback signal is decreased by the phase interval to select the output signal which leads the reference signal as the feedback signal in the phase interval, as shown in step S622.

In step S602, the output signal generated in a first fine calibration unit is delayed by coupling a programmable delay circuit in a time domain to adjust a phase of a feedback signal toward a phase of reference signal. Specifically, during the step S602, a delay length generated by the programmable delay circuit is added to the feedback signal when the feedback signal leads the reference signal. Person skilled in the art should know that the delay length can be added in a clockwise or counterclockwise direction. The feedback signal is subtracted by a delay length when the feedback signal lags the reference signal. The delay length keeps constant when the feedback signal locks the reference signal.

In step S604, the phase difference between the reference and the feedback signal is detected by a phase detector for outputting an indicating signal corresponding to the phase difference between the reference and the feedback signal. Finally, in step S606, the coarse calibration unit and the fine calibration unit are controlled by the controller to align the feedback signal to the reference signal according to the indicating signal from the phase detector.

After the step S606, the alignment to reference signal and the feedback signal is tracked by the controller, as shown in step S620. A delay length is added to the feedback signal when the feedback signal leads the reference signal during the track of alignment to reference signal and the feedback signal. A delay length is subtracted from the feedback signal when the feedback signal lags the reference signal. A delay length keeps constant when the feedback signal locks the reference signal.

In one embodiment, an alignment status between the reference signal and the feedback signal is tracked when a delay length of the programmable delay circuit added to the feedback signal is larger than a threshold boundary value. The phase interval is subtracted from the feedback signal in the predetermined phase angle when a delay length of the programmable delay circuit added to the feedback signal is smaller than a threshold boundary value. The feedback signal leads the reference signal after the phase interval is subtracted from the feedback signal.

The advantages of the present invention include: (a) adjusting the phase difference between a reference signal and a feedback signal to rapidly select a phase interval in the phase domain for the reference signal by covering the predetermined phase angle in the phase domain; (b) aligning the phase of feedback signal to that of the reference signal by a programmable delay circuit in a time domain to save the power consumption of the electronic devices; (c) implementing the controlling apparatus by digital delay-locked loop to avoid the effect of manufacturing process in the electronic devices; and (d) reducing the size of the circuit by multiplying frequency in coarse calibration unit.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An apparatus of controlling clock phase alignment, the apparatus comprising:
    a coarse calibration unit, generating a plurality of output signals, the output signals having a plurality of phase intervals therebetween, wherein a predetermined phase angle is divided by the number of the output signals to generate one of the phase intervals;
    a first fine calibration unit connected to the coarse calibration unit, delaying one of the output signals by coupling a programmable delay circuit to adjust a phase of a feedback signal to a phase of a reference signal;
    a phase detector connected to the first fine calibration unit, detecting a phase difference between the reference signal and the feedback signal and outputting an indicating signal corresponding to the phase difference between the reference signal and the feedback signal; and
    a controller, controlling the coarse calibration unit and the first fine calibration unit to align the feedback signal to the reference signal according to the indicating signal generated from the phase detector.

2. The apparatus of claim 1, wherein the coarse calibration unit comprises:
    a phase-locked loop, generating a plurality of multiplying frequency signals;
    a frequency divider coupled to the phase-locked loop, dividing the multiplying frequency signals into the output signals; and
    a multiplexer coupled to the frequency divider and the controller, selecting one of the output signals to be output into the first fine calibration unit according to a control signal from the controller.

3. The apparatus of claim 1, wherein the coarse calibration unit is measured by an angular magnitude in a phase domain.

4. The apparatus of claim 1, wherein the feedback signal is coarsely tuned in the phase intervals covering the predetermined phase angle and the tuned feedback signal is selected from the phase intervals in the coarse calibration unit to serves as an input signal to the first fine calibration unit.

5. The apparatus of claim 1, wherein the first fine calibration unit is measured by a delay length generated by the programmable delay circuit in a time domain.

6. The apparatus of claim 5, wherein the delay length of the first fine calibration unit is at least 1/N time the period of the reference signal and N is the number of the output signals.

7. The apparatus of claim 6, wherein the delay length of the first fine calibration unit is at least 1.5/N time the period of the reference signal.

8. The apparatus of claim 6, wherein the delay length of the first fine calibration unit is at least 2.0/N time the period of the reference signal.

9. The apparatus of claim 1, further comprising a second fine calibration unit connected to the first fine calibration unit and the phase detector for interpolating the signal from the first fine calibration unit.

10. The apparatus of claim 1, wherein at least one of the phase intervals is a fixed phase interval.

11. The apparatus of claim 1, wherein at least one of the phase intervals is variable phase interval.

12. The apparatus of claim 1, wherein the predetermined phase angle is complete 360 degrees.

13. The apparatus of claim 12, wherein the phase intervals between the output signals cover the predetermined phase angle.

14. The apparatus of claim 12, wherein the phase intervals between the output signals cover a portion of the predetermined phase angle.

15. A method of controlling clock phase alignment, the method comprising the steps of:
    generating a plurality of output signals in a coarse calibration unit, the output signals having a plurality of phase intervals therebetween, wherein a predetermined phase angle is divided by the number of the output signals to generate one of the phase intervals in a phase domain;
    delaying one of the output signals generated in a first fine calibration unit by coupling a programmable delay circuit in a time domain to adjust a phase of a feedback signal to a phase of reference signal;
    detecting a phase difference between the reference signal and the feedback signal by a phase detector for outputting an indicating signal corresponding to the phase difference between the reference signal and the feedback signal; and
    controlling the coarse calibration unit and the first fine calibration unit to align the feedback signal to the reference signal according to the indicating signal from the phase detector using a controller.

16. The method of claim 15, after the step of generating the output signals, further comprising increasing the phase of the feedback signal by the phase interval to repeatedly compare the reference signal with the feedback signals, respectively, using the controller.

17. The method of claim 16, during the step of increasing the phase of the feedback signal by the phase interval, further comprising recording the comparison results between the reference signal and the feedback signal from the phase detector using the controller.

18. The method of claim 17, when the comparison results between the reference signal and feedback signal are changed from a lead status into a lag or a lock status, further comprising selecting the feedback signal from the phase intervals for transmitting the output signal into the first fine calibration unit.

19. The method of claim 18, further comprising decreasing the phase of the feedback signal by the phase interval to select the output signal which leads the reference signal as the feedback signal in the phase interval.

20. The method of claim 15, wherein a delay length is added to the feedback signal when the feedback signal leads the reference signal during the step of delaying the output signal.

21. The method of claim 15, wherein the feedback signal is subtracted by a delay length when the feedback signal lags the reference signal during the step of delaying the output signal.

22. The method of claim 15, wherein a delay length keeps constant when the feedback signal locks the reference signal during the step of delaying the output signal.

23. The method of claim 15, further comprising tracking an alignment status between the reference signal and the feedback signal when a delay length of the programmable delay circuit added to the feedback signal is larger than a threshold boundary value.

24. The method of claim 15, further comprising subtracting the phase interval from the feedback signal in the predetermined phase angle when a delay length of the programmable delay circuit added to the feedback signal is smaller than a threshold boundary value.

25. The method of claim 24, wherein the feedback signal leads the reference signal after subtracting the phase interval from the feedback signal.

26. The method of claim 15, further comprising tracking the alignment to reference signal and the feedback signal after controlling the coarse calibration unit and the first fine calibration unit to align the feedback signal to the reference signal.

27. The method of claim 26, wherein a delay length is added to the feedback signal when the feedback signal leads the reference signal.

28. The method of claim 26, wherein a delay length is subtracted from the feedback signal when the feedback signal lags the reference signal during the step of delaying the output signal.

29. The method of claim 26, wherein a delay length keeps constant when the feedback signal locks the reference signal during the step of delaying the output signal.

30. The method of claim 15, wherein the delay length of the programmable delay circuit is at least 1/N time the period of the reference signal and N is the number of the output signals.

31. The method of claim 30, wherein the delay length of the programmable delay circuit is at least 1.5/N time the period of the reference signal.

* * * * *